United States Patent
Nagai et al.

(10) Patent No.: US 6,710,446 B2
(45) Date of Patent: Mar. 23, 2004

(54) SEMICONDUCTOR DEVICE COMPRISING STRESS RELAXATION LAYERS AND METHOD FOR MANUFACTURING THE SAME

(75) Inventors: Akira Nagai, Hitachi (JP); Takumi Ueno, Mito (JP); Haruo Akahoshi, Hitachi (JP); Syuji Eguchi, Tokai-mura (JP); Masahiko Ogino, Hitachi (JP); Toshiya Satoh, Kanasagou-machi (JP); Asao Nishimura, Kokubunji (JP); Ichiro Anjoh, Koganei (JP)

(73) Assignee: Renesas Technology Corporation, Tokyo (JP)

( * ) Notice: Subject to any disclaimer, the term of this patent is extended or adjusted under 35 U.S.C. 154(b) by 76 days.

(21) Appl. No.: 10/136,305

(22) Filed: May 2, 2002

(65) Prior Publication Data

US 2002/0130412 A1 Sep. 19, 2002

Related U.S. Application Data

(63) Continuation of application No. 09/446,979, filed as application No. PCT/JP98/02593 on Jun. 12, 1998, now Pat. No. 6,396,145.

(51) Int. Cl.$^7$ .............................................. H01L 23/48
(52) U.S. Cl. ........................ 257/737; 257/738; 438/108
(58) Field of Search ............................... 257/737, 738; 438/513, 614–617

(56) References Cited

U.S. PATENT DOCUMENTS 3,461,357 A * 8/1969 Mutter et al. ............... 257/737
4,472,730 A     9/1984 Ohta
5,534,731 A     7/1996 Hashimoto
5,604,379 A *   2/1997 Mori ........................... 257/738
5,753,973 A     5/1998 Yasunaga et al. ........... 257/737
5,834,848 A    11/1998 Iwasaki
6,255,737 B1    7/2001 Hashimoto .................. 257/784

FOREIGN PATENT DOCUMENTS

| DE | 19907525 | 9/1999 |
| EP | 0991119 | 4/2000 |
| TW | 358239 | 9/1999 |
| WO | 9825298 | 6/1998 |
| WO | 9856041 | 12/1998 |

* cited by examiner

*Primary Examiner*—Kamand Cuneo
*Assistant Examiner*—Lourdes Cruz
(74) *Attorney, Agent, or Firm*—Antonelli, Terry, Stout & Kraus, LLP

(57) ABSTRACT

A semiconductor device and a manufacturing method thereof, which device includes a semiconductor element arranged to form integrated circuitry, a plurality of electrode pads formed on the side of the integrated circuitry formation surface of the semiconductor element, bump electrodes for electrically connecting to the electrode pads through a conductive layer, and a stress relaxation layer formed between the integrated circuitry formation surface and electrode pads on one hand and the bump electrodes and conductive layer on the other hand, the stress relaxation layer being adhered thereto, wherein more than one third of the stress relaxation layer from a surface thereof is cut away for removal and wherein the stress relaxation layer is subdivided into a plurality of regions. Accordingly, it is possible to provide a semiconductor device capable of offering high density mounting schemes with increased reliability while reducing production costs.

10 Claims, 11 Drawing Sheets

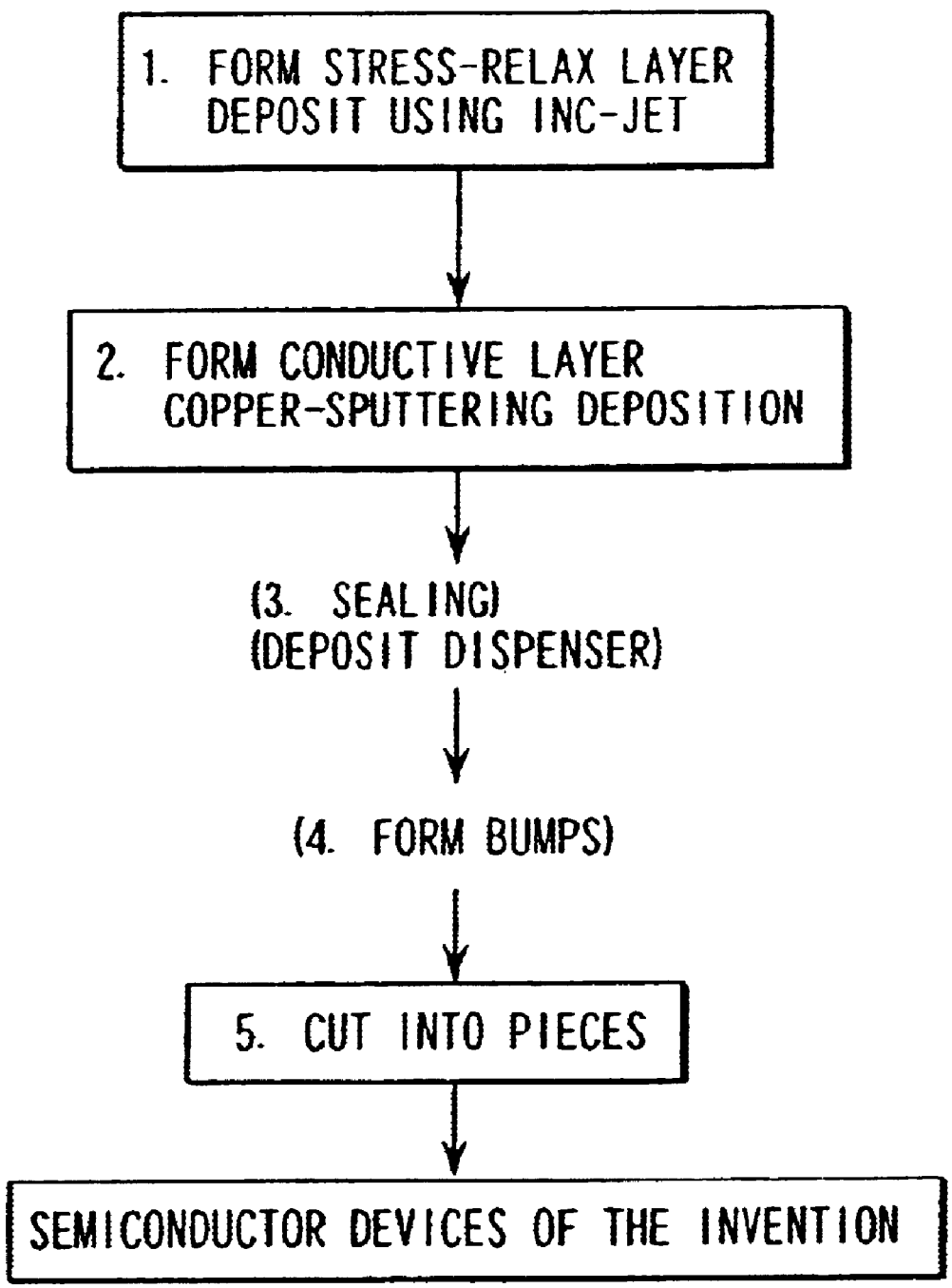

SEMICONDUCTOR DEVICE COMPRISING STRESS RELAXATION LAYERS AND METHOD FOR MANUFACTURING THE SAME

This is a continuation of parent application Ser. No 09/446,979, filed Dec. 30, 1999, now U.S. Pat. No. 6,396, 145 which is a 371 PCT/JP98/02593 filed Jun. 12, 1998 the entire disclosure of which is hereby incorporated by reference.

BACKGROUND OF THE INVENTION

The present invention relates generally to semiconductor devices as well as semiconductor modules; and, more particularly, the invention relates to architectures or techniques for fabricating semiconductor elements in a form capable of being mounted in units of wafers and for subdividing this into necessary sizes to thereby obtain the intended semiconductor devices.

In recent years, as electrical and electronic parts or components are increasing more and more in performance, semiconductor elements have likewise increased in integration density and functionality in a way such that the IC complexity has advanced from large-scale integration (LSI) to very-large-scale integration (VLSI), and finally to ultralarge-scale integration (ULSI). Such technological growth results in further increases in dimension and pin number, plus the operating rate of the elements involved. To accommodate this technical trend, package structures for use with multiple-pin semiconductor devices have been shifted from those having connection terminals at two opposite sides of a semiconductor element to others having connection terminals arrayed along four side edges thereof. Further, in order to meet the needs for multi-pin package schemes, so-called "grid array" structures have been developed and reduced to practice, which are designed to employ a multi-layer carrier substrate for permitting required connection terminals to be laid out into a grid-like pattern on the entire area of a parts-mount surface. The grid-array structures typically include a ball grid array (BGA) structure that has presently been employed from time to time, which is arranged so that those terminals used therein are of a ball-like shape to thereby enable achievement of high-speed signal transmission and low inductance. In addition, to attain the high-speed signal transmissivity required, a multilayer carrier substrate made of chosen organic materials has been used, which materials are inherently lower in dielectricity than currently available inorganic materials. Unfortunately, the use of such organic materials resulted in many problems relating to the difficulty of attaining enhanced reliability due to the presence of risks of occurrence of electrical connection defects, including unwanted open-circuiting and/or short-circuiting, because of the fact that the organic materials are inherently greater in thermal expansion coefficient than standard silicon-based materials that have been often employed for semiconductor elements; and, for this reason, thermal stresses can take place due to possible differences in thermal expansion coefficient therebetween.

Moreover, from the view point of high-density mounting/packaging design schemes today, a need also exists for a semiconductor device of the chip scale package (CSP) structure type which is substantially the same in size as a semiconductor element associated therewith. One typical known approach to achieving this is to employ a specific structure that eliminates the use of any carrier substrate in the CSP with BGA structures. This is a mount structure permitting direct connection between a semiconductor element and its associated mount substrate or board, and one typical package structure incorporating this principle has been disclosed in U.S. Pat. No. 5,148,265, which is capable of improving the reliability of connector portions by making use of a chosen material that is low in modulus of elasticity to reduce or "relax" any possible stress forces occurring due to thermal expansion coefficient differences between the semiconductor element and its mount board. This package structure is designed so that the required electrical interconnection between the semiconductor element and the mount board is done by use of a lead tape made of an organic material such as polyimide or, in the alternative, of the carrier substrate. Due to this, wire-bonding techniques or other similar bonding methods using electrical leads are employed for electrical connection portions including external terminals of the semiconductor element and those conductive circuit sections of such lead tape. Additionally ball-like terminals made of solder or the like are used for connection between the lead tape and the mount board's conductive portions. The manufacture of this structure does require an increased number of new process steps including, but not limited to, the steps of disposing a low-elasticity material at the semiconductor element, connecting the lead tape, forming ball terminals, and then sealing electrical connection portions; accordingly, this approach requires a new manufacturing facility, while also requiring that the individual one of resultant semiconductor devices be assembled and mounted on a per-chip basis, which would result in association of many disadvantages as to the manufacturability when compared to prior art methods thereby causing the CSP structure's inherent advantages of high-density mountability to be less achievable during reduction to practice.

The present invention has been made in light of the technical background stated above to provide an improved semiconductor device manufacturing method which is low in cost and excellent in mass-productivity for enabling, through use of low-elasticity organic materials, a reduction or relaxation of thermal stresses occurring between a semiconductor element or elements of grid-array structure accommodatable to multi-pin design schemes and its associative mount substrate or board for fabrication into a specific form mountable in units of wafers, to thereby achieve subdivision into necessary sizes, along with a semiconductor device or module which is excellent in reliability of electrical connection and high-speed signal transmissivity plus multi-pin scheme accommodatability.

SUMMARY OF THE INVENTION

The present invention provides a semiconductor device which comprises a semiconductor element for formation of integrated circuitry, a plurality of electrode pads that formed on an integrated circuit formation surface side of the semiconductor element, bump electrodes for external connection electrically connected to the electrode pads through a conductive layer, and a stress relaxation layer that is formed between the integrated circuit formation surface and electrode pads on one hand and the bump electrodes and conductive layer on the other hand and is adhered thereto, wherein the semiconductor device is featured in that more than one third of the stress relaxation layer from a surface thereof is cut away for removal and in that the stress relaxation layer is divided into a plurality of regions.

The present invention may be applied to a semiconductor device having a plurality of pads formed in peripheral regions of the integrated circuit formation surface of a semiconductor element, one or several external electrodes electrically connected via a conductive layer to the pads, and a stress relaxation layer that is adhered to the integrated circuit formation surface and the pads plus the external electrodes as well as the conductive layer. The stress relaxation layer or stress buffering layer may be subdivided into a plurality of portions independently of one another. Optionally, a sealing resin may be provided which is in close contact with the stress relaxation layer. Where necessary, the sealing resin may come with division slits at appropriate positions for reduction of virtual modulus of elasticity to thereby suppress those stress forces being applied to the semiconductor element. More than one third of the stress relaxation material from its surface is cut away for removal, and this stress relaxation material may be divided in a way corresponding to each conductive layer.

The stress relaxation layer or stress buffer layer functions to make moderate or "soften" those thermal stresses that can take place due to possible differences in thermal expansion coefficient between the semiconductor elements and its associative mount substrate or board. Any one of the stress relaxation layer and buffer materials along with an elastic material layer and buffering layer plus buffer-material layer as well as low-elasticity material layer, as will be discussed later in this description, offers similar functionalities for suppression of thermal stress forces.

The present invention also provides a semiconductor device which comprises a semiconductor chip having a plurality of unitary semiconductor elements that are arranged to form an integrated circuit, a plurality of electrode pads that are formed on an integrated circuit formation surface side of the semiconductor elements, one or more bump electrodes for external connection that are connected via a conductive layer to the electrode pads, and an elastic material layer that is bonded to the integrated circuit formation surfaces of the semiconductor elements and the pads plus the bump electrodes as well as the conductive layer, featured in that the elastic layer is divided into a plurality of regions with respect to each of the unitary semiconductor elements.

In addition, the present invention provides a semiconductor wafer which comprises a semiconductive wafer having thereon a plurality of unitary semiconductor elements that form integrated circuitry, a plurality of conductive connection portions formed on the side of integrated circuit formation surfaces of the semiconductor elements, more than one external electrode for external connection that is connected to the conductive connection portions via a conductive layer, and a buffering material that is adhered to the integrated circuit formation surfaces of the semiconductor elements and the conductive connection portions plus the external electrode as well as the conductive layer, featured in that the buffer material is subdivided into a plurality of regions within a region of the unitary semiconductor elements.

The instant invention also provides a method of manufacture of a semiconductor device featured in that the method comprises the steps of forming a buffer layer on an integrated circuit formation surface of a semiconductor wafer that has a plurality of unitary semiconductor elements arranged to form integrated circuitry and also has a plurality of electrode pads on the side of integrated circuit formation surfaces of the unitary semiconductor elements in a way such that the buffer layer is adhered to the integrated circuit formation surfaces and the electrode pads, subdividing the buffer layer into a plurality of regions by cutting away for removal more than one third thereof from its surface, forming on or over the resultant buffer layer thus subdivided those bump electrodes for external connection and a conductive layer for use in connecting the electrode pads to the bump electrodes, and thereafter performing subdivision in units of the unitary semiconductor elements.

Further, this invention provides a method of manufacture of a semiconductor device comprising the steps of forming a buffer material layer on an integrated circuit formation surface of a semiconductor wafer that has a plurality of unitary semiconductor elements arranged to form integrated circuitry and also has a plurality of conductive pads in peripheral regions on the integrated circuit formation surfaces of the unitary semiconductor elements in such a manner that the buffer layer is adhered or bonded to the integrated circuit formation surfaces and the conductive pads, dividing the buffer layer into a plurality of regions by cutting it for removal, forming on or over the resultant buffer layer thus divided those external connection bumps and a conductive layer for letting the electrode pads be connected to the bump electrodes, and thereafter performing separation in units of the unitary semiconductor elements.

The invention may also be applicable to a method of manufacturing a semiconductor device that employs a semiconductor wafer having thereon a plurality of pads as formed in the central region of the integrated circuit formation surface of a semiconductor element. This manufacturing method is arranged to include the steps of forming a low-elasticity material layer on the integrated circuit formation surface of a semiconductor wafer having a plurality of pads in a way such that the low-elasticity material layer is adhered or bonded to the integrated circuit formation surface and the pads, dividing the low-elasticity material layer into a plurality of regions through cutaway for removal of more than one third of the low-elasticity material layer from its surface, forming on or over the resultant low-elasticity material layer thus divided certain bump electrodes and a conductive layer for use in letting the pads be connected to the bump electrodes, and performing separation with respect to each chip that contains therein at least one unitary semiconductor element.

The invention is also applicable to a semiconductor wafer manufacturing method which includes the step of forming a buffering material on an integrated circuit formation surface of a semiconductor wafer having a plurality of unitary semiconductor elements arranged to form integrated circuitry and also having a plurality of electrode pads on the side of integrated circuit formation surfaces of the semiconductor elements in such a manner that the buffering material is bonded to the integrated circuit surfaces and the electrode pads in a way independent in units of the electrode pads.

The present invention further provides a semiconductor module that is featured by comprising a semiconductor device including a semiconductor chip having a plurality of unitary semiconductor elements, a plurality of electrode pads formed at the unitary semiconductor elements, a stress relax layer that is adhered to the integrated circuit formation surfaces of the semiconductor elements and the electrode pads plus the bump electrodes as well as the conductive layer and is subdivided into a plurality of regions, and any one of a sealing layer made of resin and protective coating as formed on the integrated circuit formation surfaces of the unitary semiconductor elements, wherein the semiconductor device is electrically connected to a mount substrate or board via the bump electrode for external connection. The invention is also applicable to a semiconductor module having a plurality of semiconductor devices that are mounted on a single mount substrate.

In the foregoing and following explanations, any one of those terms "pad electrodes," "pads," "conductive connection sections," "conductive pads," "circuit electrodes," "connection conductor portions," and "circuit pads," which are formed on the integrated circuit formation surface(s) of the semiconductor element(s), may refer to certain nodes or terminals for connection to either external electrodes or bump electrodes. Additionally the terms "bumps" and "bump electrodes" as well as "external electrodes" as used herein may refer to those external terminals adapted for connection to the parts-mount substrate being used.

BRIEF DESCRIPTION OF THE DRAWINGS

FIG. 7 is a flow diagram showing a method of forming a stress relaxation layer.

DESCRIPTION OF THE PREFERRED EMBODIMENTS

Figure 1:
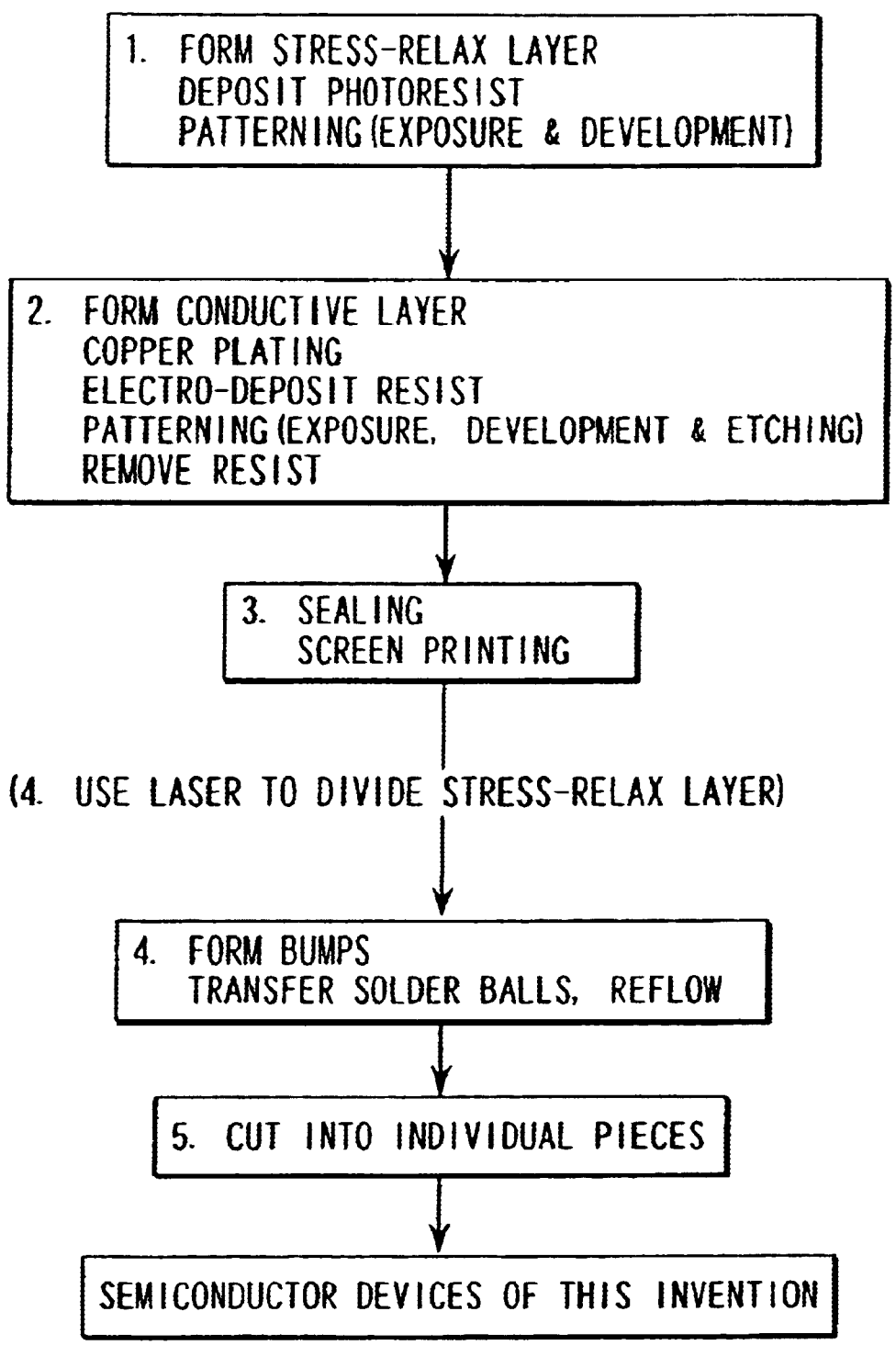
FIGS. 1 and 2 are process flow diagrams showing one example of a method of manufacturing a semiconductor device of the present invention.

An explanation will now be given of the means for achieving the present invention.

In the present specification, the wording "semiconductor element arranged to form integrated circuitry" may refer to an integrated circuit having at least one built-in circuit including a memory, logic, and microcomputer or else-practically, such as an LSI, VLSI, ULSI or other similar highly integrated ICs. In such a semiconductor element, one or more electrode pads for use as input/output terminal regions capable of inputting and outputting signals from and to external circuitry are formed so as to be electrically connected to a circuit section on the integrated circuit formation side. Further, in accordance with this invention, bump electrodes for external connection are formed so as to overlie the electrode pads with a conductive layer interposed therebetween. In accordance with this invention, it is required that more than one conductor section be formed on or over an insulative or dielectric layer which is subdivided through patterning into a plurality of portions in order to finally let the semiconductor element be electrically connected to its associative mount substrate of board. This dielectric layer will later be used as a stress relaxation layer or stress buffering layer. This conductor section is comprised of a conductive layer portion that is formed to extend from an electrode pad of an element along the side-wall(s) of the dielectric layer for serving as an electrical lead and a bump electrode portion for direct connection with the mount board.

As a method of forming the conductor section, there are two methods, one of which is for fabricating both the conductive layer portion and the bump electrode at a time, and the other of which is for forming them at separate process steps. The conductive layer portion may preferably be made of copper-based materials in view of the lower resistivity thereof. Methods for forming conductive leads made of copper include a metal-plating method and a deposition method. Although the metal-plating method may be more advantageous and preferable than the deposition method for successful fabrication of the intended conductive layer that stays uniform up to the inside of a hole of a circular shape with increased aspect ratio, the former should require a longer period of time for completing the fabrication than the latter. For example, while the deposition method requires approximately five (5) minutes to form the copper to a thickness of 3 micrometers ($\mu$m), the metal-plating method requires one hour or more. Due to this, it will be required to adequately select which one of such methods must be used to form a pattern shape of the dielectric layer for forming a copper conductive circuit layer made of copper.

As a method of patterning the conductive section, there are two approaches, one of which is for selectively metallizing or depositing only required portions in advance by resist printing techniques, and the other of which is for pre-performing either metallization or deposition with respect to the entire surface and then using a resist or the like to let necessary portions continue to reside while removing away the remaining unnecessary portions. In the case of the former, the addition of the selectivity of either the metal-plating or deposition between an exposed dielectric layer portion and a resist surface is important. To do this, optimization or the like is carried out for deposition of catalytic substance and/or resist surface conditions. In case a conductive layer is formed on the entire surface of the dielectric layer of the latter, use of electro-deposited resist will be effective due to the fact that a conductor is formed on the entire surface. Performing a series of process steps including resist electro-deposition and exposure plus development along with etching treatment makes it possible to carry out the intended patterning of the conductive section. Etching liquid used therein may be currently available copper etchant such as dilute sulfuric acid, nitric acid, iron chloride, copper chloride, ammonium persulfate or the like. It will be preferable that said conductive layer be formed to extend along the sidewall of either the stress relaxation layer or buffer layer which acts as a stress relaxation layer having an inclination. Forming a conductive layer on the sidewall of such slanted or inclined stress relaxation layer makes it possible to make moderate or "relax" any possible distortion occurring due to thermal stress forces along the thickness and/or mechanical stresses, which in turn enables a further increase in reliability at connection portions concerned.

Figure 16:
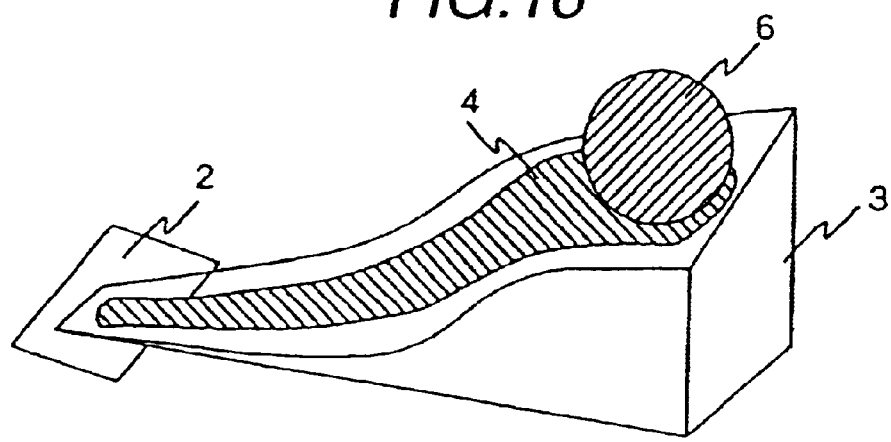
FIG. 16 is an enlarged perspective view of a stress relax layer and conductive layer used in the semiconductor device embodying the invention.
Figure 13A:
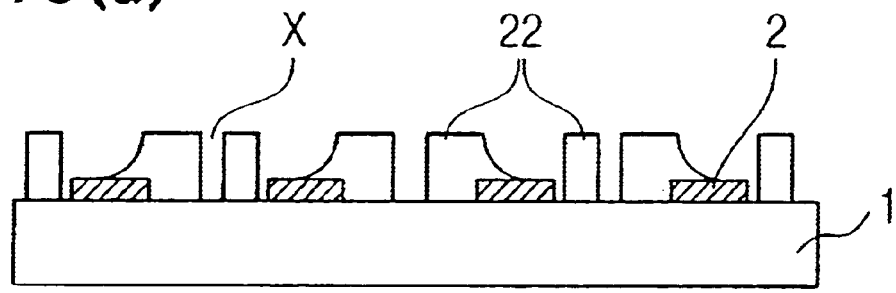
FIG. 13 is a process flow diagram showing another method of manufacturing the semiconductor device.
Figure 13B:
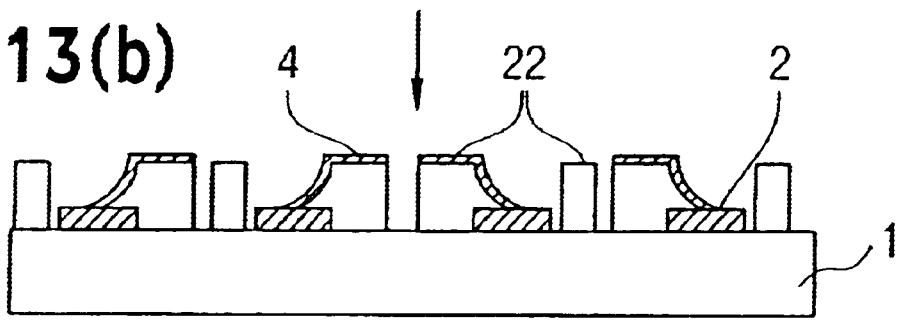
Figure 13C:
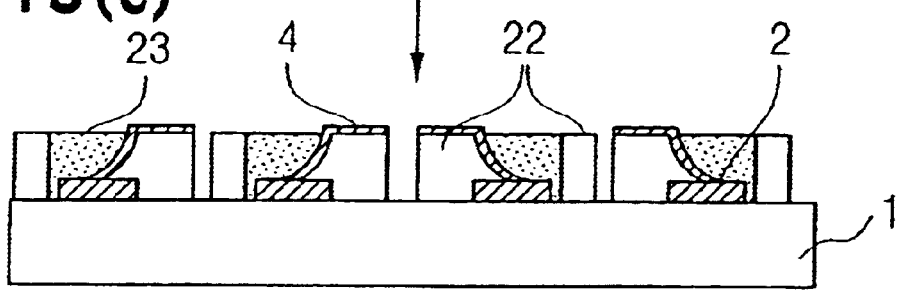
Figure 13D:
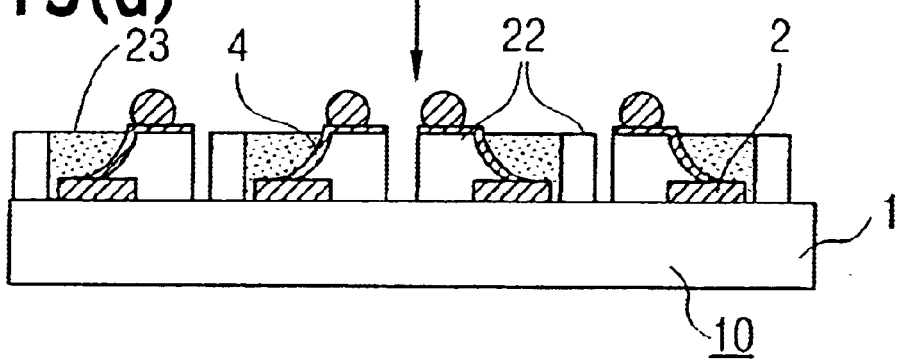

It should be noted here that the conductive layer that has been formed along the sidewall of the slanted stress relaxation layer is such that, by letting it change continuously in conductor width, it becomes possible to provide successful relaxation. Practically, the intended relaxation is effectively achievable by making the semiconductor element I s electrode pad side finer and narrower, thereby causing it to gradually increase in width in a direction toward the side of a bump electrode that acts as an external terminal one representative example is shown in FIG. 16.

Next, the dielectric layer is pattern section is sealed for protection of those connection portions between the semiconductor element is electrode pads and the conductive layer. At this time, although this sealing material may be made unlimitedly of any materials that offer sufficient adhesive strength relative to the dielectric layer, it will be desirable that certain materials be employed which are the same in base material as that forming the dielectric layer. Use of such same-system materials enables addition of increased adhesivity because of their good affinity due to the fact that they have the same values in physical property such as elasticity and thermal resistivity and also are similar in chemical structure.

Even after having the sealing process is completed, the result is not completely predictable in one case the resultant stress relaxation layer is capable of retaining the intended division state; in another case, the expected effect of subdivision is lost due to resin sealing. In the latter case, it will be preferable that the division by use of a laser be done after the resin sealing was applied to the entire surface. Also note that in cases where the seal material being used has less elasticity than the stress relaxation layer, such division using a laser is no longer required because of the fact that even if the stress relaxation layer's region thus divided is buried by the seal material, then transmission of the force would function as an independent stress relaxation layer in some cases to ensure that the effect of division is hardly deteriorated. The sealing method may include, but is not limited to, injection methods using dispensers, mask print methods or the like.

In the instant invention, it is required to form bump electrodes for use as external terminal portions for letting the semiconductor element be electrically connected to a mount substrate or board via a conductive layer. These bump electrodes may be designed to have ball bumps, land bump structures and the like. Such bump electrodes are manufacturable by metal-plating/metallization methods, ball transfer methods, paste printing methods and others. Certain materials with excellent corrosion resistance and increased mountability may be chosen therefor, which typically conclude gold, gold/nickel-lamination film, gold/copper-lamination film or other similar suitable film-like layers. A variety of kinds of solder composition materials will also be useful since these are good in mass-productivity.

In accordance with the present invention, a stress relaxation layer is formed between said bump electrodes and said conductive layer, which layer is for relaxation of those stress forces based on possible differences in coefficient of thermal expansion between the semiconductor element and its associated mount substrate or board while at the same time serving as an electrical insulative layer. This stress relaxation layer is the one that corresponds to said dielectric layer.

In accordance with this invention, either the stress relaxation layer or buffer layer is the layer that has a elasticity capable of offering the intended effects of the invention. Preferably this layer is made of a chosen material of 0.1 MPa to 1 GPa at room temperatures. Particularly, but not exclusively, the thickness of it is preferably determined to fall within a range of from 1 to 1,500 $\mu$m—more preferably, 10 to 200 $\mu$m.

In accordance with this invention, the stress relaxation layer or buffer layer is comprised of certain resin materials such as for example epoxy resin, phenol resin, urethane resin, maleyimide resin, polyimide, polyoxazole, polyfluoroethylene, polysiloxane, polybutadiene, or other similar suitable materials, along with copolymer materials thereof and denatured ones. To provide such a stress layer or buffer layer which is low in elasticity, it will be permissible to design it to have multi-cellular or porous structures. Note however that as long as this stress relaxation layer or buffer layer is subdivided into portions to thereby eliminate unwanted application of excessive stress forces on the semiconductor chip and conductive layer bumps, and in cases where a sealing resin as filled into the space is of low elasticity, it will not always be necessary for the stress relaxation layer's resin per se to be a low-elasticity material.

One typical methodology adaptable for use as the method of forming the stress relaxation layer may be a method that is designed to proceed with the next process step of forming a stress relaxation layer and external terminals while permitting the size of a wafer to be kept unchanged without performing dicing of a circuitry-fabricated wafer into pieces, by way of example. The first step is to form a stress relaxation layer made of low-elasticity dielectric material that is employable as the stress relaxation layer. In this case several methods are available, one of which is to make use of photosensitive materials. The photosensitive materials may be generally classified in nature into two groups: liquid resin, and film like one. In the former case, spin-coating or curtain-coating or printing techniques are used to form a deposition film to thereby fabricate the intended dielectric layer on the entire surface of a wafer under manufacture (this will function as a stress relaxation layer in case it is disposed on a semiconductor device). In the case of a film, it is possible to use roll-lamination methods or press-machining methods or else to form such dielectric layer on the entire wafer surface. Next, the dielectric layer is subject to patterning by use of an appropriate mask. Through such patterning process, those connection pads on the wafer are exposed while simultaneously defining the shape of the dielectric layer as required to form one or more conductor portions having the intended stress relaxation mechanism.

At this time, the stress relaxation layer may be formed so that it is subdivided into a plurality of individual portions. Note here that another approach to attaining the same is also available—that is, after having formed a stress relaxation layer having an integral structure on the entire wafer surface, then at a separate later process step, more than one-third thereof is removed and cut away from a surface layer by using a laser or the like, thereby causing the stress relaxation layer to be divided into a plurality of regions.

Photosensitive resin materials capable of exposure and development as stated supra may include acrylic resin, a resin composition comprised of epoxy resin and acrylic resin, a vinyl-ester resin composition of epoxy resin and acrylic acid plus a vinyl monomer chemically reacted together, a polyimide, and the like. For presently available materials, many photosensitive dielectric materials and their rubber denatured compositions which have been employed as resist and/or photo-via materials, these will also be applicable through careful selection of the elasticity thereof.

The photovia materials are particularly preferable among them, which consist essentially of a resist material including a vinyl-ester resin and also an epoxy resin composition along with a resin composition that contains therein epoxy resin and acrylic resin components. In cases where these are employed, one preferable way is to set a roll laminator to be under pressures of 0.01 to 10 kgf/cm at temperatures ranging from room temperature up to 200° C. by way of example; and, in the case of press-machining schemes, processing is done under pressures of 1 to 50 kgf/cm at temperatures of from room temperature up to 200° C. In the case of printing methods, if screen-print techniques are preferable, then it is a general approach that printing is carried out at those temperatures at or near room temperature. For spin-coat methods, it will be preferable that the intended printing be done at the speed of from 100 to 10,000 rpm at room temperature. For curtain-coat methods, printing is done at speeds of from 10 to 100 mm/second at room temperature.

Upon effectuation of such patterning, a high-pressure mercury lamp or lamps are employed to give off rays of ultraviolet (UV) light for exposure. A developing solution may be chosen on a case-by-case basis depending on what kind of resin is used—preferably, but not limitatively, a known alkali liquid developer is used.

An alternative method of forming the dielectric layer required uses a liquid resin or film—this may be comprised of generally known low-elasticity materials without exhibiting any photosensitivity—formed on the entire surface of a wafer of interest by using the similar method as discussed previously; then, patterning is carried out by use of either a laser or a combination of an oxygen plasma and a mask to thereby obtain a specified shape. At this time, the plasma is typically obtainable by using either an oxygen gas or a mixture gas of oxygen and fluoride, such as $CF_4$ or the like. In addition, as the laser, there are an excimer laser, a YAG laser, a carbon dioxide gas laser and others—among them, the carbon dioxide gas laser will be effective because it offers increased processing speeds and enhanced usability. Any material for use as the dielectric layer in this case will not always be required to offer photosensitivity, and it is preferable that material selection be made by taking account of specific physical characteristics of resin including the low elasticity and high heat resistivity. Representative low-elasticity materials must be epoxy resin, polyimide resin, oxazole resin and cyanate resin along with rubber denatured materials and rubber-added ones thereof. Use of porous materials will also be preferable in view of achievement of low elasticity. Among these materials, epoxy resin is preferably employable due to the fact that this resin is hardenable at relatively low temperatures at or pear 150° C. while its hardened material stays low in moisture absorption characteristic with production costs reduced.

Other methods for achieving simultaneous effectuation of both the dielectric layer fabrication and the patterning required are available, which include print methods, ink-jet methods, optical shaping/molding methods, deposition methods, multiphoton polymerization methods and the like. Among these methods, the print methods may be an easy methodology that is capable of obtaining the intended dielectric layer by performing printing processes by a method of patterning a resin with certain flowability by use of either a screen mask or stencil mask and thereafter effectuating hardening and solidifying of the resin due to optical or thermal cross-linking reaction. In contrast, the ink-jet methods and optical shaping methods require installation of a specially designed apparatus; however, these methods offer enhanced micro-patterning abilities and are thus effective in forming dielectric layers that measure 50 $\mu$m or less in width. Further, deposition methods and multiphoton polymerization methods with semiconductor circuit fabrication technologies applied thereto offer an ability to fabricate finer shapes, which will thus be effective for fabrication of thin dielectric layers of 1 $\mu$m or less in width.

One significant feature of the semiconductor device incorporating the principles of the invention is that more than one third of its stress relaxation layer or buffer layer from the surface thereof is removed and cut away to be subdivided into a plurality of regions on a semiconductor chip. One example is that a semiconductor device having on a wafer with a semiconductor integrated circuit formed thereon a stress relaxation layer for reduction of thermal stress forces relative to a mount substrate or board and also its overlying structure having bump electrodes for use as external terminals while letting said stress relax layer be such that more than one third thereof is cut away from its surface to be split into a plurality of regions is manufactured to have a dimension equivalent to the wafer size and then is finally divided into pieces. Cutting away more than one third of the stress relaxation layer from its surface for subdividing this stress relaxation layer into a plurality of regions makes it possible to make smaller a region that moves cooperatively when absorbing stress forces to thereby obtain a readily deformable structure, which in turn enables enhancement of the stress relaxation effects. This makes it possible to permit the stress relaxation layer to offer sufficient plasticity or resiliency even in the event that thermal stress forces can take place between the semiconductor element and its associated mount substrate or board in temperature cycles and the like, which leads to an ability to improve the electrical connection reliability of those external terminals for use in connecting between the semiconductor element and mount substrate. Additionally, dividing the stress relaxation layer advantageously serves to facilitate any water components absorbed by a package during storage or custody of such semiconductor device to escape toward the outside during reflowing of mount parts or components, thereby allowing the package to increase in anti-reflow reliability.

In accordance with the present invention, there is provided a method of manufacturing individual semiconductor devices by preparing an aggregated body of the semiconductor devices having the above-noted arrangements in units of wafers and finally separating it into those chips each containing a unitary semiconductor element. In addition, since a module with the semiconductor device of this invention mounted therein comprises a semiconductor device excellent in anti-reflow characteristics and temperature cycle resistivity, the device is higher in integration density and reliability than the prior art. The stress relaxation layer at this time may be obtained by performing specified patterning processes using a photosensitive resin or alternatively by patterning a thermally hardenable resin using either a laser or oxygen plasma. Still another methodology of forming the stress relaxation layer is available, which may include those methods which follow: patterning by print techniques using either a screen mask or stencil mask, patterning by ink-jet techniques, patterning by optical shaping techniques, organic deposition techniques of the type used in semiconductor lead manufacturing processes, multiphoton polymerization techniques employing microelectronics mechanical systems. Also note that letting the stress relaxation layer be set at 1 GPa or less in elasticity at 25° C. makes it possible to obtain superior reliability in electrical connection between the semiconductor element and mount substrate or board being used.

One possible approach to dividing the stress relaxation layer is to employ division methods using the patterning techniques discussed above; while, another approach to such layer division is to use a laser or the like to remove and cut away more than one third from a top surface layer at a specified location after having formed a stress relaxation layer on the entire surface. In addition, various forms are still available as the division state covering from a binary-division scheme for causing a plurality of bump electrodes to be formed at a single stress relaxation layer to an independent structure with each of such bump electrodes being formed at the individual one of the stress relaxation layers involved.

An explanation will next be given of preferred embodiments of the present invention in conjunction with the accompanying figures of the drawing.

Figure 2A:
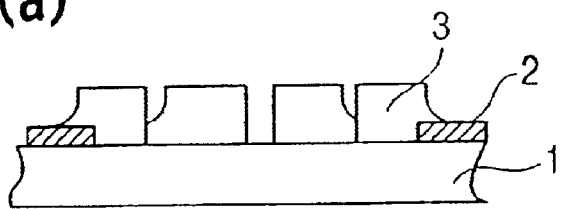

See FIG. 1, which shows one exemplary method of manufacturing a semiconductor device in accordance with one preferred embodiment of the instant invention. FIG. 2 illustrates, in cross-section, some of the major process steps in the manufacture of semiconductor chips on a per-wafer basis by use of the manufacturing method of FIG. 1. The manufacturing procedure begins with a step of depositing by screen-print techniques an epoxy-based photosensitive liquid resin material on the entire surface of a wafer 1 with integrated circuitry (not shown) formed thereon. After completion of such deposition, any residual solvent and the electrode pads 2 are dried to thereby obtain a film that measures 150 micrometers ($\mu$m) in thickness. Then, a mask (not shown) is placed on the resultant structure to perform ultraviolet (UV) exposure for effectuation of cross-link reaction at specified portions; thereafter, patterning is performed by using an alkali developer liquid to thereby fabricate a stress relaxation layer 3 as shown in FIG. 2(a). At this time the electrode pads 2 on the wafer are also exposed due to patterning.

Figure 2B:
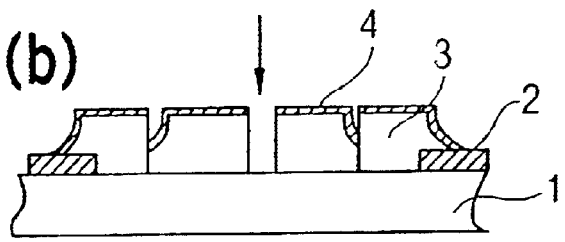
Figure 2C:
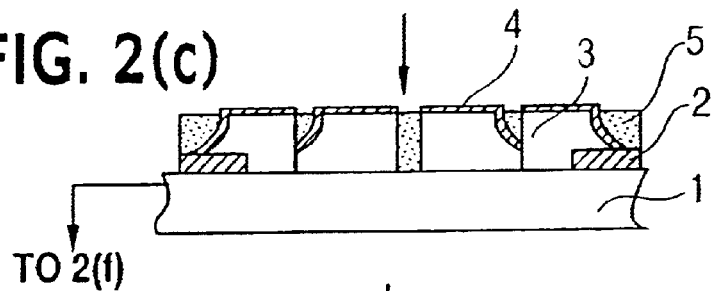
Figure 2D:
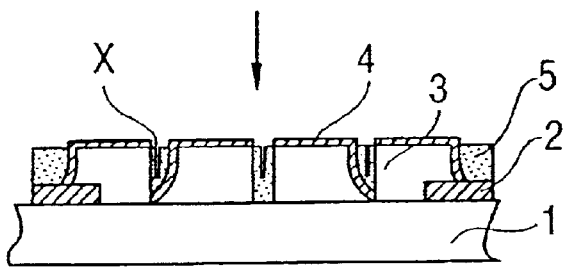

The procedure goes next to a step of forming by electroless metal-plating or metallization techniques a copper layer on the entire surface of the wafer 1 and stress relaxation layer 3, to a thickness of 10 $\mu$m. Then, for patterning of conductor portions, an electro-deposited resist film is formed to a thickness of 5 $\mu$m; thereafter, UV exposure is carried out using a mask for acceleration of the cross-link reaction with respect to specified portions; then, patterning is performed by using an alkali developer liquid to thereby remove unnecessary copper portions (conductive portions) using a chosen etching liquid, thus forming after removal of the resist a conductive layer 4 as shown in FIG. 2(b). Next, screen-print techniques are employed to provide an epoxy-based liquid sealing resin material for fulfillment as shown in FIG. 2(c) for purposes of protection of certain contact or junction portions from external environments, which portions are between the electrode pads 2 on the wafer 1 and the metallized conductive layer 4. Use of such liquid resin of the solvent-less type at this time ensures that any unwanted film loss will no longer take place after completion of hardening process, which makes it possible to achieve successful filling/sealing effects. Additionally, as shown in FIG. 2(d), the resultant seal resin layer 5 is subject to laser machining for defining therein cutaway portions to thereby reduce or suppress stress forces that can be applied to chips. It will be desirable that the depth of cutaway portions as designated by reference character "x" be set at a prespecified value that is greater than or equal to one third of the thickness of the seal resin layer.

Figure 2E:
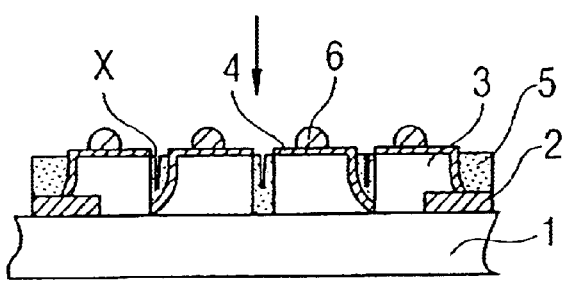
Figure 2F:
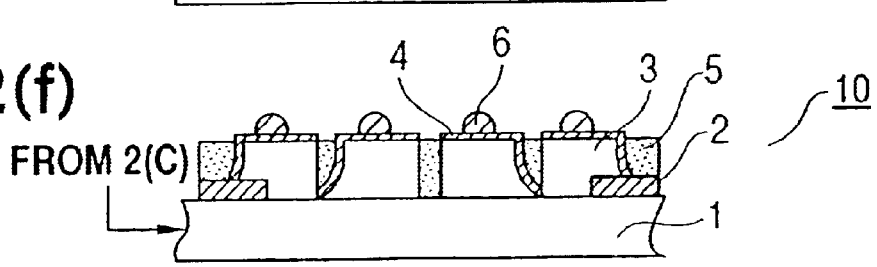

Next, ball-like bump electrodes 6 are fabricated by solder ball-transfer and reflow techniques at exposed portions of the conductor sections as shown in FIG. 2(e) in order to facilitate electrical interconnection with a mount substrate or board.

Finally, the wafer is sub-divided into individual pieces to thereby obtain the intended semiconductor device 10.

Figure 3:
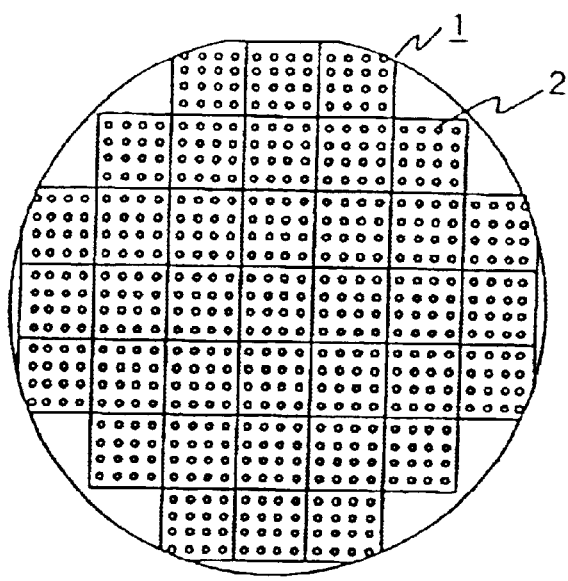
FIG. 3 is a plan-view showing a planar structure of a semiconductor wafer as used in the instant invention.

Turning to FIG. 3, there is shown an example with electrode pads 2 formed in two opposite regions at the periphery of a circuit type surf ace side of the wafer, which diagram is a plan view of the wafer 1 that is usable in accordance with the present invention with the electrode pads 2 being formed thereon.

Figure 4:
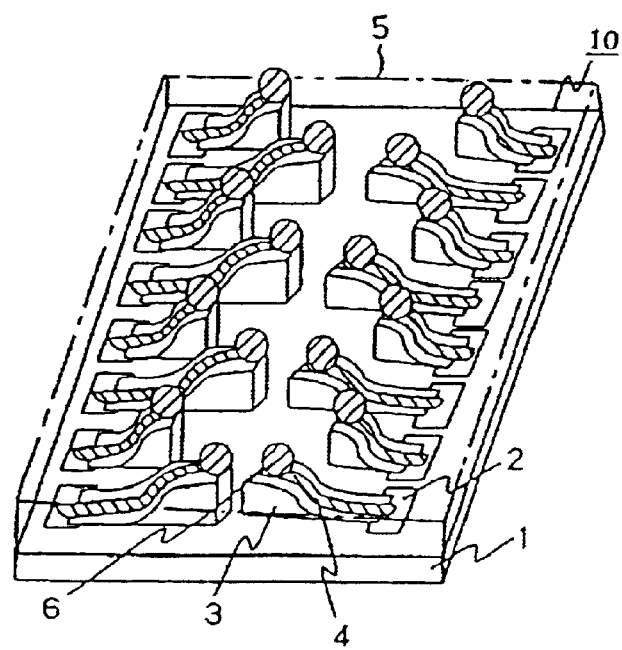
FIG. 4 is a perspective view of a semiconductor device of this invention.

FIG. 4 is a diagram showing a perspective view of the semiconductor device embodying the invention in the state that the sealing layer made of resin is not formed yet. The sealing resin layer 5 is formed as indicated by dash-dot lines. As shown in FIG. 4, the stress relaxation layer 3 is arranged so that it is subdivided in a way corresponding to the bump electrodes 6 or the conductive layer 4 that is to be connected to these bump electrodes or the electrode pads 2 to thereby minimize those stress forces being applied to the wafer 1.

Figure 5:
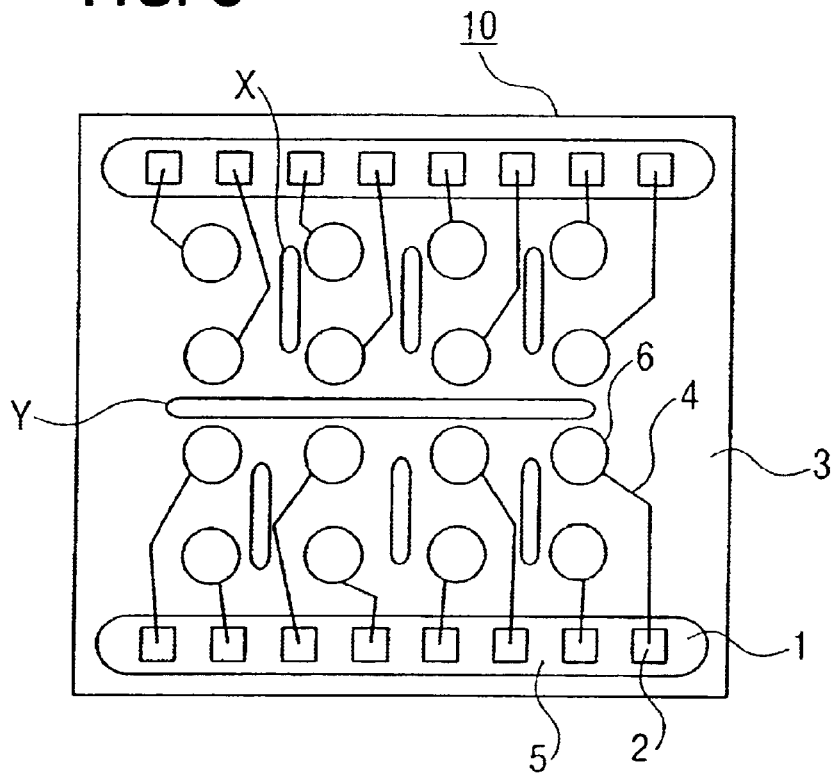
FIGS. 5–6 are diagrams each depicting a plan view of a semiconductor device of the invention.
Figure 6:
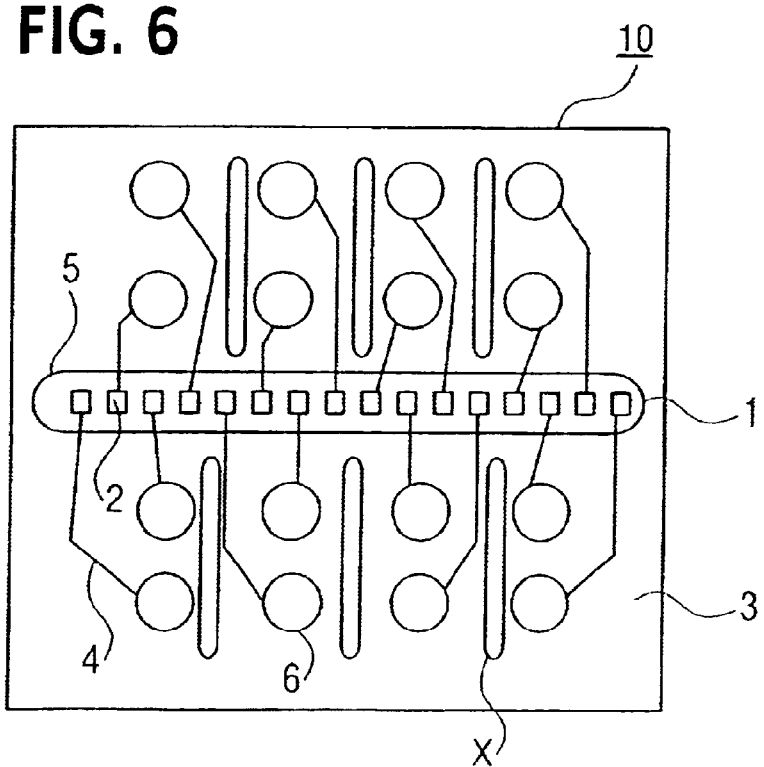

FIGS. 5 and 6 are diagrams each showing a plan view of a semiconductor device also embodying the invention. FIG. 5 shows a structure with the electrode pads 2 being formed in two opposite regions near or around the circuit formation surface side, whereas FIG. 6 depicts a structure with the electrode pads 2 formed in a single direction in a central region of the circuit formation surface. In FIGS. 5–6, reference character "Y" is used to designate a groove for subdivision, which groove is defined in the stress relaxation layer 3 by cutting for removal of more than one third of the thickness thereof, which is for lowering a virtual elastic coefficient or modulus of the stress relaxation layer thereby reducing the stress force components as applied to semiconductor chips. Reference character "x" as used herein designates those slits which are formed in the sealing resin layer 5. In FIG. 6, the dividing groove Y is not provided because of the fact that the positions of the electrode pads are center pads.

Figure 8A:
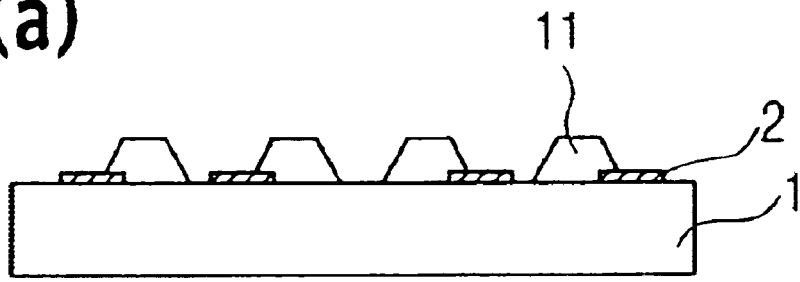
FIG. 8 is a partial flow diagram of said flow process.
Figure 8B:
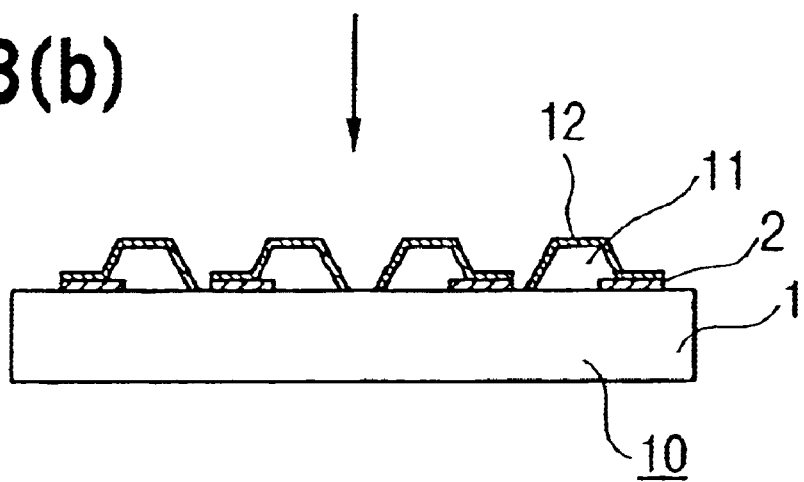
Figure 9:
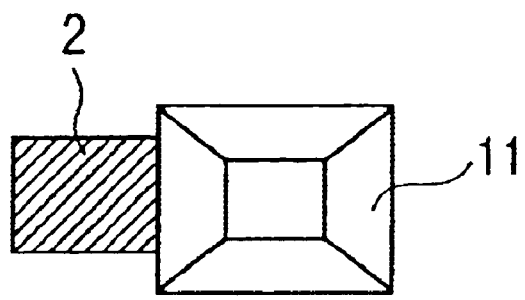
FIG. 9 is a diagram showing a plan view of a semiconductor device embodying the invention for indication of a stress relax layer and electrical lead thereof

FIGS. 7 and 8 show a method of forming by ink-jet techniques a resin material only at specified locations, which resin is for use in forming a stress relaxation layer 11 overlying the wafer 1 with a semiconductor circuit formed thereon, Whereby, the stress relaxation layer 11 is formed on the electrode pads 2 of a chip or chips. FIG. 9 is a diagram that shows a top plan view of a single electrode pad unit of a semiconductor element of FIG. 8(a).

Next, a copper film was formed by sputter-deposition techniques to a thickness of 5 $\mu$m, on both a pattern surface of the exposed stress relaxation layer 11 and surfaces of the electrode pads 2 on the wafer 1; then, a gold film was deposited to a thickness of 0.5 $\mu$m so that a conductive layer 12 was formed. In this case, it is possible to uniformly fabricate by deposition the conductive layer 12 due to the absence of any hole shapes with high aspect ratios or the like.

It is also noted that, since no etching treatment is required for the conductive layer 12, those surfaces of the electrode pads 2 on the wafer 1 are perfectly covered or coated with a corrosion-resistant metallic material. Owing to this, resin sealing of pad junction interfaces is generally unnecessary; however, certain resin may optionally be filled therein for purposes of increasing the reliability when the need arises. Liquid resin fulfillment using dispensers is an easy-to-use method since it requires no masks. Since a stress relaxation layer obtained by this method with a conductive layer attached thereto has a convex structure of low elasticity from the wafer surface, this layer per se will be used as an external terminal for electrical connection to its associated mount substrate. It is thus possible to eliminate the need for bump fabrication process steps. To enhance the mountability, more than one ball-like bump may be added. Bump forming methods may include paste-printing techniques, paste ink-jet techniques, ball transfer techniques and the like. Finally, the wafer is cut into chips each including a unitary semiconductor element to thereby obtain the intended semiconductor device as shown in FIG. 8(b).

Figures 10A, 10B, 10C, 10D:
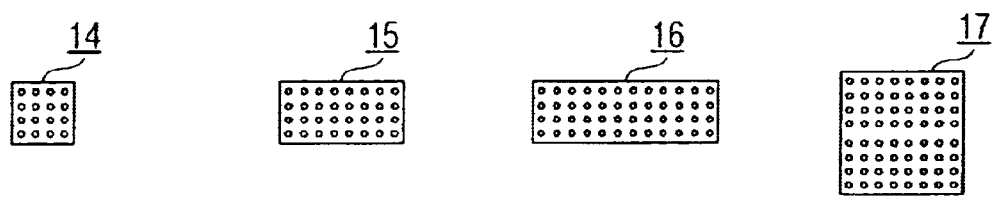
FIGS. 10(a) to 10(d) are diagrams showing several plan views of a variety of kinds of structures of those semiconductor chips as used in the invention.

In FIG. 10, semiconductor chips 14–17 may be split into a unitary semiconductor element (a) or one of the chips (b) to (d) each containing a plurality of unitary semiconductor elements.

Figure 11:
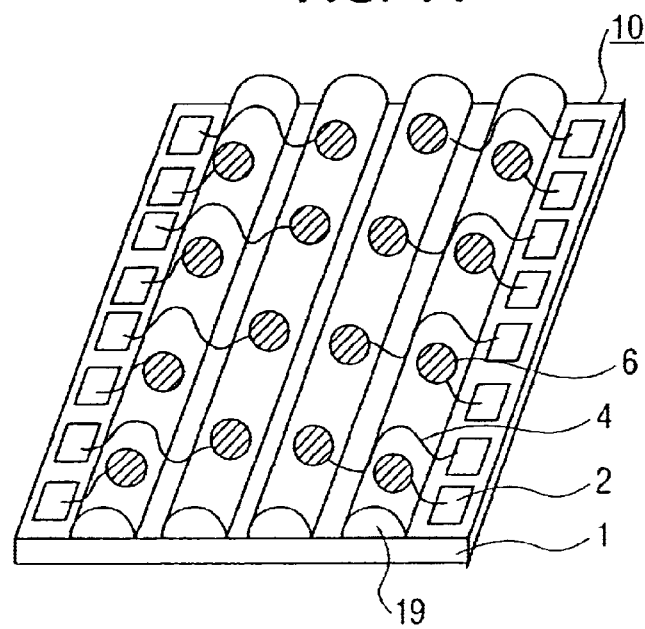
FIGS. 11–12 are diagrams each showing a perspective view of the entire structure of another example of the semiconductor device of the invention.
Figure 12:
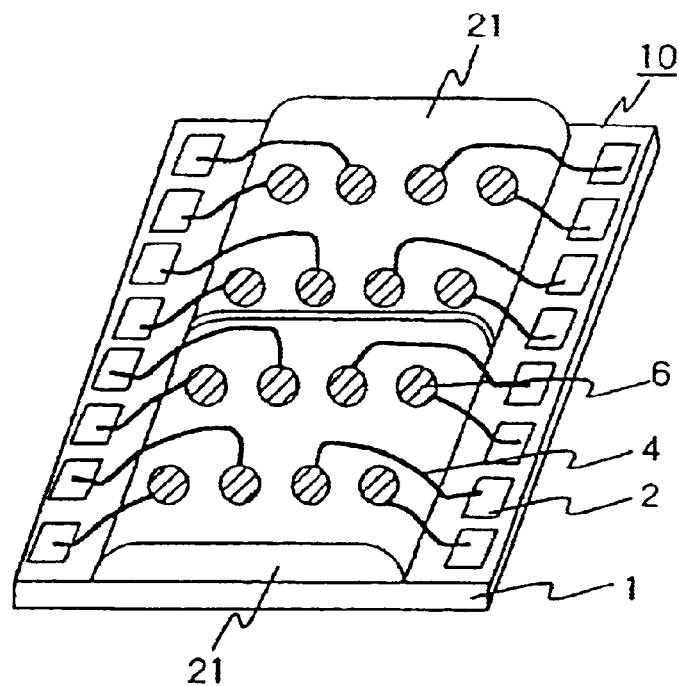

FIGS. 11 and 12 are examples of a semiconductor device which have a different stress relaxation layer from that stated previously. In FIG. 11, a stress relaxation layer 19 is formed so that it is subdivided in units of columns of the bump electrodes 6 for use as external terminals. Alternatively, FIG. 12 is one example of a semiconductor device with an integrated stress relaxation layer 21 being finally divided. Letting a plurality of stress relaxation layers be divided in this way makes it possible to reduce or make moderate those stress forces with respect to semiconductor elements, thereby enabling reduction in amount of any possible distortion occurring at such semiconductor elements. It is also possible to facilitate the escape of water components absorbed by a package toward the outside; thus, the connection reliability during parts-mount reflow processes may be greatly improved.

FIG. 13 shows still another method of manufacturing the semiconductor device in accordance with the invention. As shown in FIG. 13 (a), a stress relaxation layer 22 is split into a plurality of portions to thereby ensure that vacant or "gap" regions that are not integrated by resin materials 2, 3 are present even after completion of such resin sealing. This method is free from any limitations as to the elasticity of a seal material used while avoiding the need for cutaway processes using a laser or the like, which makes it possible to provide a manufacturing method that is extremely high in degree of freedom.

Figure 14:
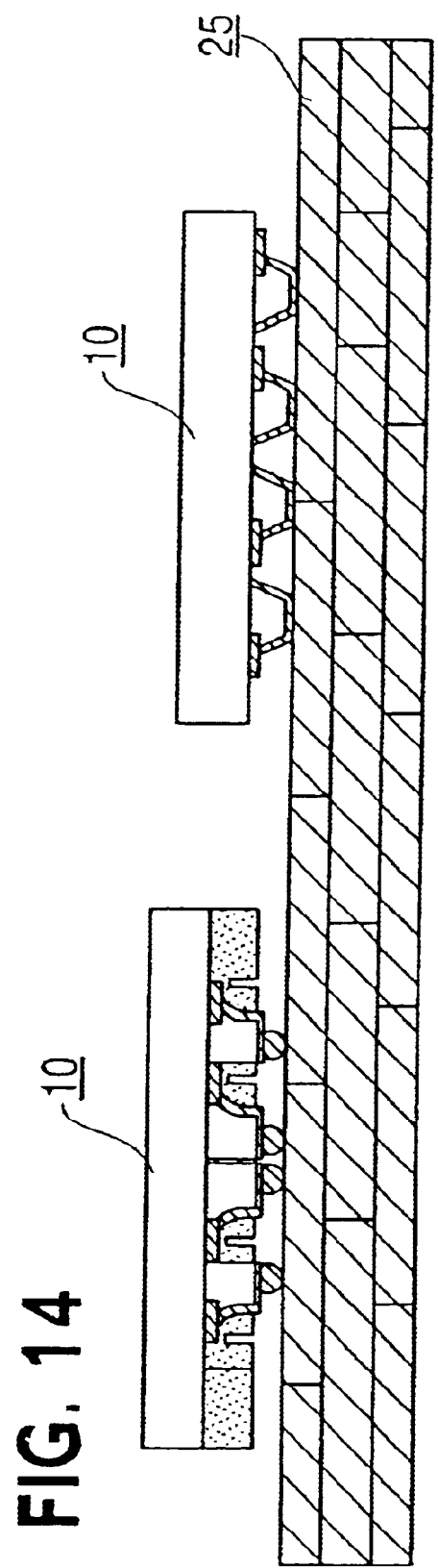
FIGS. 14–15 are sectional diagrams each showing a structure of a module with the semiconductor device of the invention being mounted thereon.
Figure 15:
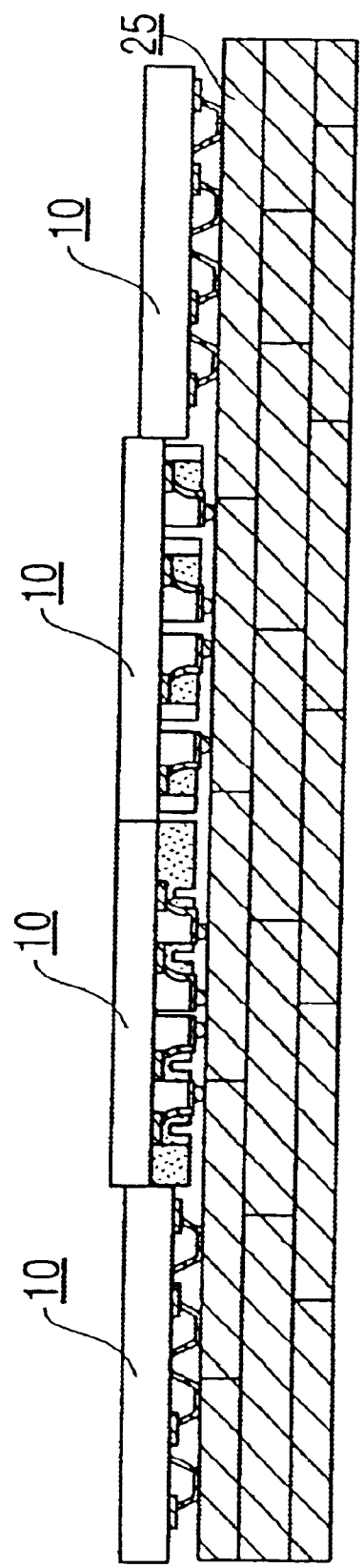

FIGS. 14 and 15 are diagrams each showing a sectional view of a module with the semiconductor devices of this invention being built on a mount board or substrate 25. Since the semiconductor devices 10 of the invention have excellent anti-reflow characteristics and connection reliability, it becomes possible to lay out the semiconductor devices so as to come closer to each other when compared to the prior art, to thereby enable achievement of high-integration mountability, which in turn makes it possible to obtain an improved module of further increased reliability.

As has been explained above in detail, according to the present invention, it is possible to offer several advantages. More specifically, it is possible to significantly reduce the production cost and time while providing a structure of high reliability, by manufacturing, on a wafer with semiconductor circuitry formed thereon, a structure in per-wafer size which has both a stress relaxation layer for reduction of the thermal stress relative to a parts-mount substrate or board and one or more external terminals capable of electrical connection with the mount substrate and then finally subdividing it into individual pieces or chips to thereby obtain the intended semiconductor device(s). Another advantage is that use of the stress relaxation layer as arranged within the semiconductor device makes it possible to reduce thermal stress forces occurring between the mount substrate and associative elements during temperature cycling test procedures thus attaining higher reliability. A further advantage is that the semiconductor device is identical in size to the semiconductor element, thereby enabling achievement of high-density mounting.

The present invention as disclosed and claimed herein is adaptable for use in providing those semiconductor devices that are excellent in reliability of connection between semiconductor elements and a mount substrate or board associated therewith and also in high-speed signal transmission as well as in multiple-pin accommodatability along with high-density/high-reliability modules which employ such semiconductor devices.

What is claimed is:

1. A semiconductor device comprising a semiconductor element, a plurality of circuit electrodes formed on a circuit formation surface side of the semiconductor element, external electrodes connected to the circuit electrodes through conductive layers, and stress relaxation layers which are adhered to the circuit formation surface of the semiconductor element, the circuit electrodes, the external electrodes and the conductive layers, wherein each of the stress relaxation layers is provided with an inclined structure in a direction of the thickness of each stress relaxation layer, the stress relaxation layers each having a degree of elasticity of 1 Gpa or less at 25° C.

2. A semiconductor device according to claim 1, wherein the stress relaxation layers each contain a material selected from the group consisting of epoxy resin and polysiloxane.

3. A semiconductor device according to claim 1, wherein the stress relaxation layers are each divided into a plurality of regions.

4. A semiconductor device according to claim 2, wherein the stress relaxation layers are each divided into a plurality of regions.

5. A semiconductor device comprising a semiconductor element, a plurality of circuit electrodes formed on a circuit formation surface side of the semiconductor element, external electrodes connected to the circuit electrodes through conductive layers, and stress relaxation layers which are adhered to the circuit formation surface of the semiconductor element, the circuit electrodes, the external electrodes and the conductive layers, wherein each of the stress relaxation layers is provided with an inclined structure in a direction of the thickness of each stress relaxation layer, and wherein each conductive layer has a conductive width which changes continuously from each circuit electrode to each external electrode.

6. A method of manufacturing a semiconductor device, comprising the steps of:

forming buffer layers on a integrated circuit formation side of a semiconductor wafer having a plurality of unitary semiconductor elements arranged to form integrated circuitry and further a plurality of electrode pads on the integrated circuit formation side of the semiconductor wafer so that the buffer layers are adhered to the integrated circuit formation surface and the plurality of electrode pads and are each provided with an inclined structure in a direction of the thickness of each buffer layer;

forming conductive layers along the inclined surface of the buffer layers so as to connect the conductive layers to the electrode pads;

forming bump electrodes on the conductive layers; and thereafter performing subdivision in units of the unitary semiconductor elements.

7. A method of manufacturing a semiconductor device according to claim 6, wherein the buffer layers are formed with a printing technique.

8. A method of manufacturing a semiconductor device according to claim 6, wherein when the buffer layers are formed, patterning is performed by use of a laser and a mask.

9. A method of manufacturing a semiconductor device according to claim 6, further comprising the step of subdividing each buffer layer into a plurality of regions by cutting away more than one third of each buffer layer from a surface thereof.

10. A method of manufacturing a semiconductor device according to claim 6, wherein the conductive layers each have a conductive width which changes continuously from each circuit electrode to each external electrode.

* * * * *